(12) United States Patent
Seo et al.

(10) Patent No.: US 8,937,327 B2
(45) Date of Patent: Jan. 20, 2015

(54) LIGHT EMITTING DEVICE HAVING PLURALITY OF LIGHT EMITTING CELLS AND METHOD OF FABRICATING THE SAME

(75) Inventors: Won Cheol Seo, Ansan-si (KR); Dae Sung Kal, Ansan-si (KR); Joon Hee Lee, Ansan-si (KR); Chang Youn Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 442 days.

(21) Appl. No.: 13/202,210

(22) PCT Filed: Mar. 24, 2010

(86) PCT No.: PCT/KR2010/001804
§ 371 (c)(1),
(2), (4) Date: Aug. 18, 2011

(87) PCT Pub. No.: WO2010/114250
PCT Pub. Date: Oct. 7, 2010

(65) Prior Publication Data
US 2011/0297972 A1    Dec. 8, 2011

(30) Foreign Application Priority Data

Mar. 31, 2009    (KR) .................. 10-2009-0027227
Mar. 31, 2009    (KR) .................. 10-2009-0027228

(51) Int. Cl.
*H01L 33/00*    (2010.01)
*H01L 25/075*    (2006.01)
(Continued)

(52) U.S. Cl.
CPC ........... *H01L 25/0753* (2013.01); *H01L 27/153* (2013.01); *H01L 33/0079* (2013.01); *H01L 33/38* (2013.01); *H01L 33/405* (2013.01); *H01L 33/641* (2013.01); *H01L 2933/0016* (2013.01)
USPC .............................. 257/98; 257/99; 257/100

(58) Field of Classification Search
USPC .................................................. 257/98–100
See application file for complete search history.

(56) References Cited

U.S. PATENT DOCUMENTS 7,417,259 B2    8/2008    Sakai et al.
2008/0191632 A1    8/2008    Lee
(Continued)

FOREIGN PATENT DOCUMENTS

JP    2007-173549    7/2007
KR    10-0599012    7/2006
(Continued)

OTHER PUBLICATIONS

International Search Report for PCT/KR2010/001804 mailed on Oct. 7, 2010.
(Continued)

*Primary Examiner* — Samuel Gebremariam
(74) *Attorney, Agent, or Firm* — H.C. Park & Associates, PLC

(57) ABSTRACT

A light emitting device having a plurality of light emitting cells is disclosed. The light emitting device comprises a substrate; a plurality of light emitting cells positioned on the substrate to be spaced apart from one another, each of the light emitting cells comprising a p-type lower semiconductor layer, an active layer and an n-type upper semiconductor layer; p-electrodes positioned to be spaced apart from one another between the substrate and the light emitting cells, the respective p-electrodes being electrically connected to the corresponding lower semiconductor layers, each of the p-electrodes having an extension extending toward adjacent one of the light emitting cells; n-electrodes disposed on upper surfaces of the respective light emitting cells, wherein a contact surface of each of the n-electrodes electrically contacting with each light emitting cell exists both sides of any straight line that bisects the light emitting cell across the center of the upper surface of the light emitting cell; a side insulating layer for covering sides of the light emitting cells; and wires for connecting the p-electrodes and the n-electrodes, the wires being spaced apart from the sides of the light emitting cells by the side insulating layer.

20 Claims, 8 Drawing Sheets

(51) Int. Cl.
*H01L 27/15* (2006.01)
*H01L 33/38* (2010.01)
*H01L 33/40* (2010.01)
*H01L 33/64* (2010.01)

(56) References Cited

U.S. PATENT DOCUMENTS

2009/0008654 A1* 1/2009 Nagai .............................. 257/88

2009/0026972 A1 1/2009 Shakuda

FOREIGN PATENT DOCUMENTS

KR 10-2008-0002161 1/2008
WO 2004/023568 8/2003

OTHER PUBLICATIONS

Written Opinion for PCT/KR2010/001804 mailed on Oct. 7, 2010.

* cited by examiner

PRIOR ART

LIGHT EMITTING DEVICE HAVING PLURALITY OF LIGHT EMITTING CELLS AND METHOD OF FABRICATING THE SAME

CROSS REFERENCE TO RELATED APPLICATIONS

This application is the National Stage of International Application No. PCT/KR2010/001804, filed on Mar. 24, 2010, and claims priority from and the benefit of Korean Patent Application No. 10-2009-0027227, filed on Mar. 31, 2009, and Korean Patent Application No 10-2009-0027228, filed on Mar. 31, 2009, which are all hereby incorporated by reference for all purposes as if fully set forth herein.

BACKGROUND OF THE INVENTION

1. Field of the Invention

The present invention relates to a light emitting device and a method of fabricating the same, and more particularly, to a light emitting device having a plurality of light is emitting cells having a vertical structure in which an n-electrode and a p-electrode are respectively formed on upper and lower portions of each light emitting cell.

2. Discussion of the Background

GaN-based light emitting diodes (LEDs) are widely used for display and backlights. Further, LEDs have less electric power consumption and a longer lifespan as compared with conventional light bulbs or fluorescent lamps, so that the LEDs have been substituted for conventional incandescent bulbs and fluorescent lamps and their application areas have been expanded to the use thereof for general illumination.

Recently, LEDs have been commercialized, which are directly connected to a high-voltage DC or AC power source to emit light. For example, an LED capable of being directly connected to a high-voltage DC or AC power source is disclosed in PCT Patent Publication No. WO 2004/023568A1 (SAKAI et. al.), entitled "LIGHT-EMITTING DEVICE HAVING LIGHT-EMITTING ELEMENTS."

According to PCT Patent Publication No. WO 2004/023568A1, LEDs are two-dimensionally connected on a single insulative substrate such as a sapphire substrate to form serial LED arrays. Such serial LED arrays can be driven by a high-voltage DC power source. Further, there is provided a single-chip light emitting device capable of being driven by a high-voltage AC power source by allowing such LED arrays to be connected in reverse parallel on the sapphire substrate.

Since the light emitting device has light emitting cells formed on a substrate used as a growth substrate, e.g., a sapphire substrate, the light emitting cells have a limitation in structure, and there is a limitation in improving light extraction efficiency. To solve such a problem, a method of fabricating a light emitting device having a plurality of light emitting cells using a substrate separation process is disclosed in Korean Patent No. 10-0599012, entitled "LIGHT EMITTING DIODE HAVING THERMAL CONDUCTIVE SUBSTRATE AND METHOD OF FABRICATING THE SAME."

FIGS. 1 to 4 are sectional views illustrating a method of fabricating a light emitting device according to a prior art.

Referring to FIG. 1, semiconductor layers comprising a buffer layer 23, an n-type semiconductor layer 25, an active layer 27 and a p-type semiconductor layer 29 are formed on a sacrificial substrate 21. A first metal layer 31 is formed on the semiconductor layers, and a second metal layer 53 is formed on a substrate 51 that is separate from the sacrificial substrate 21. The first metal layer 31 may comprise a reflective metal layer. The second metal layer 53 is joined with the first metal layer 31 so that the substrate 51 is bonded on the semiconductor layers.

Referring to FIG. 2, after the substrate 51 is bonded, the sacrificial layer 21 is separated by a laser lift-off process. Also, after the substrate 21 is separated, the remaining is buffer layer 23 is removed, and a surface of the n-type semiconductor layer 25 is exposed.

Referring to FIG. 3, the semiconductor layers 25, 27 and 29 and the metal layers 31 and 53 are patterned using photolithography and etching techniques to form metal patterns 40 spaced apart from one another and light emitting cells 30 positioned on regions of the respective metal patterns 40. Each of the light emitting cells 30 comprises a patterned p-type semiconductor layer 29a, a patterned active layer 27a and a patterned n-type semiconductor layer 25a.

Referring to FIG. 4, metal wires 57 are formed to electrically connect top surfaces of the light emitting cells 30 to the metal patterns 40 adjacent thereto. The metal wires 57 allow the light emitting cells 30 to be connected therethrough, thereby forming a serial array of light emitting cells. Electrode pads 55 for connecting the metal wires 57 may be formed on the n-type semiconductor layers 25a. Electrode pads may also be formed on the metal patterns 40. Two or more arrays may be formed and these arrays are connected in reverse parallel, so to that an LED capable of being driven by an AC power source is provided.

According to the prior art, thermal dissipation performance of the LED can be improved since the substrate 51 can be selected from a variety of substrates, and light extraction efficiency can be enhanced by treating a surface of the n-type semiconductor layer 25a. Further, a first metal layer 31a comprises a reflective metal layer and reflects light traveling from the light is emitting cells 30 toward the substrate 51, so that the light emitting efficiency can be more improved.

However, in the prior art, while the semiconductor layers 25, 27 and 29 and the metal layers 31 and 53 are patterned, etch byproducts of a metallic material may be stuck to side walls of the light emitting cells 30, and therefore, a short circuit between the n-type semiconductor layer 25a and the p-type semiconductor layer 29a may occur. Further, a surface of the first metal layer 31a, which is exposed while the semiconductor layers 25, 27 and 29 are etched, may be easily damaged by plasma. When the first metal layer 31a comprises a reflective metal layer such as Ag or Al, such etching damage may be serious. Since the surface of the metal layer 31a is damaged by plasma, the adhesion of the wires 57 or electrode pads formed on the metal layer 31a is lowered, resulting in a device failure.

Meanwhile, according to the prior art, the first metal layer 31 may comprise a reflective metal layer, thereby reflecting light traveling from the light emitting cells 30 toward the substrate 51. However, etching damage may occur on the reflective metal layers that are exposed to a space between the light emitting cells 30, and the reflective metal layers may be easily oxidized due to their exposure to the outside. Particularly, the oxidation of the exposed reflective metal layers is not limited to the exposed portions but progresses toward regions below the light emitting cells 30, thereby lowering reflectivity of the reflective metal layers.

Further, in the prior art, since the metal pattern is in contact with the bottom surface of each light emitting cell, current in a lower semiconductor layer can be smoothly distributed through the metal pattern. However, the position of the metal wire that is in contact with the top surface of each light emitting cell is limited to a corner or edge of the light emitting cell. Therefore, current is necessarily distributed through an upper semiconductor layer. However, since the semiconductor layer 25a generally has a relatively higher specific resistivity than a metal material layer, current is not smoothly distributed but concentrated on the contact portion of the metal wire. The concentration of the current degrades the light emitting efficiency of the light emitting cells.

SUMMARY OF THE INVENTION

Exemplary embodiments of the present invention provide a light emitting device having a plurality of light emitting cells having a vertical structure, in which current can be smoothly distributed.

Exemplary embodiments of the present invention provide a light emitting device having a plurality of light emitting cells, in which a short circuit in a light emitting cell due to metallic etch byproducts can be prevented, and a method of fabricating the same.

Exemplary embodiments of the present invention provide a light emitting device, is in which a reflective metal layer can be prevented from being deteriorated due to etching or oxidation, and a method of fabricating the same.

Exemplary embodiments of the present invention provide a light emitting device having a plurality of light emitting cells, in which a short circuit in the light emitting cell due to metallic etch byproducts can be prevented without deteriorating heat dissipation performance, and a method of fabricating the same.

The present invention provides a light emitting device having a plurality of light emitting cells and a method of fabricating the same. A light emitting device according to one aspect of the present invention comprises: a support substrate; a plurality of light emitting cells spaced apart from one another on the support substrate, each of the light emitting cells comprising a first conductive-type upper semiconductor layer, an active layer and a second conductive-type lower semiconductor layer; electrodes spaced apart from one another between the support substrate and the light emitting cells, the respective electrodes being electrically connected to the corresponding lower semiconductor layers, each of the electrodes having an extension extending toward adjacent one of the light emitting cells; an interlayer insulating layer interposed between the support substrate and the electrodes and having a relatively higher thermal conductivity than silver paste; and a bonding metal interposed between the support substrate and the interlayer insulating layer. Accordingly, it is unnecessary to form a metal pattern using a bonding metal, and the heat dissipation performance of the light emitting device is not deteriorated because the interlayer insulating layer has a relatively higher thermal conductivity than silver paste usually used for mounting a chip.

The silver paste used for mounting a light emitting diode chip has a thermal conductivity of about 0.578 W/mK. Thus, when the interlayer insulating layer having a relatively high thermal conductivity than the silver paste is used, the heat dissipation performance of the light emitting device is no longer deteriorated by the interlayer insulating layer. The interlayer insulating layer may be formed, for example, of a silicon oxide layer ($SiO_2$), silicon nitride layer ($Si_3N_4$), aluminum nitride layer (AlN) or polymer epoxy.

Each of the electrodes may comprise a reflective structure and a protective metal layer. The reflective structure reflects light emitted from a light emitting layer and advances toward a support substrate. The reflective structure may be a single or multiple reflective metal layer(s) formed of Ag, Al, Rh, Pt or alloy thereof, or may be a distributed Bragg reflection (DBR) structure.

Further, the reflective structure may be confined within a lower region of the lower semiconductor layer, and the protective metal layer may cover side and lower surfaces of the reflective structure. Thus, it is possible to prevent the reflective structure from being exposed to the outside.

Meanwhile, an etching prevention layer may be positioned between the electrodes and regions between the light emitting cells, and may have at least a portion extending underneath edges of adjacent light emitting cells. The etching prevention layer may also have an opening for exposing the extension of the electrode. By the etching prevention layer, it is possible to prevent the electrodes from being exposed when they are formed, thereby preventing the production of metallic etch byproducts.

In the meantime, the side insulating layer may cover the sides of the light emitting cells, and the wires may be spaced from the sides of the light emitting cells by the side insulating layer, thereby electrically connecting the light emitting cells to one another. Each of the wires has one end electrically connected to the upper semiconductor layer of one light emitting cell and the other end electrically connected to the lower semiconductor layer of a neighboring light emitting cell through the opening of the etching prevention layer.

Meanwhile, each of the upper semiconductor layers may have a roughened surface. The roughened surface causes light extraction efficiency to increase.

Also, the substrate may be a sapphire substrate. Generally, when a substrate separation process is used, a thermal conductive substrate different from the sapphire substrate is employed as a bonding substrate. However, the present invention is not particularly limited to the bonding substrate. On the contrary, a sapphire substrate may be preferably employed as a is bonding substrate. Accordingly, the same substrate as the growth substrate of the semiconductor layers is used as the bonding substrate, so that the substrate separation process and subsequent patterning processes can be safely performed.

A method of fabricating a light emitting device having a plurality of light emitting cells according to another aspect of the present invention comprises: forming compound semiconductor layers having a first conductive-type semiconductor layer, a second conductive-type semiconductor layer and an active layer interposed between the first and second conductive-type semiconductor layers on a sacrificial substrate, the first conductive-type semiconductor layer being disposed close to the sacrificial substrate; forming electrodes on the compound semiconductor layers, the electrodes being spaced apart from one another; forming an interlayer insulating layer having a relatively high thermal conductivity than silver paste on the electrodes; bonding a support substrate on the interlayer insulating layer; removing the sacrificial substrate to expose the first conductive-type semiconductor layer; and patterning the compound semiconductor layers to form the plurality of light emitting cells spaced apart from one another. Accordingly, it is unnecessary to pattern the bonding metal, and thus, the production of etch byproducts of the bonding metal can be prevented in advance. Further, since the interlayer insulating layer having a relatively higher thermal conductivity than the silver paste is formed, the heat dissipation performance of the light emitting device is not deteriorated by the interlayer is insulating layer in the actual operation of the light emitting device.

Meanwhile, the forming of the electrodes may comprise forming reflective structures spaced apart from one another; and forming a protective metal layer for covering the reflective structures.

The method may further comprise forming an etching prevention layer on the compound semiconductor layers. At this time, the etching prevention layer has openings for exposing the second conductive-type semiconductor layers. Meanwhile, the reflective structures may be formed in the openings of the etching prevention layer.

More specifically, the method of fabricating a light emitting device may comprise: forming compound semiconductor layers on a sacrificial substrate, the compound semiconductor layers comprising a first conductive-type semiconductor layer, a second conductive-type semiconductor layer and an active layer interposed therebetween, the first conductive-type semiconductor layer being disposed close to the sacrificial substrate; forming an etching prevention layer on the compound semiconductor layers, the etching prevention layer having openings through which the second conductive-type semiconductor layer is exposed; forming electrodes to be filled in the openings of the etching prevention layer, each of the electrodes having an extension extending to a top of the etching prevention layer, the electrodes being spaced apart from one another; forming an interlayer insulating layer having a relatively is higher thermal conductivity than the silver paste on the electrodes; bonding a substrate to the interlayer insulating layer; removing the sacrificial substrate to expose the first conductive-type semiconductor layer; patterning the compound semiconductor layers so that the etching prevention layer is exposed, thereby forming a plurality of light emitting cells spaced apart from one another; forming a side insulating layer for covering the light emitting cells and exposing at least a portion of an upper surface of the first conductive-type semiconductor layer, and patterning the etching prevention layer to form openings through which the electrodes are exposed; and forming wires for connecting the first conductive-type semiconductor layer to the exposed electrodes.

According to the aforementioned method, when patterning the compound semiconductor layers to form the plurality of light emitting cells, the etching prevention layer prevents the electrodes from being exposed to the outside. Accordingly, it is possible to thoroughly prevent metallic etch byproducts from being stuck to side walls of the light emitting cells. The etching prevention layer may be formed of an insulating layer such as a silicon oxide or nitride layer.

The forming of the electrodes may comprise forming a reflective structure in each opening of the etching prevention layer; and forming a protective metal layer for covering the reflective structure. Accordingly, it is possible to prevent the reflective structure from being is exposed to the outside.

In addition, a roughened surface may be formed on the exposed upper surface of the first conductive-type semiconductor layer.

A light emitting device having a plurality of light emitting cells according to a further aspect of the present invention comprises: a substrate; a plurality of light emitting cells spaced apart from one another on the substrate, each of the light emitting cells comprising a p-type lower semiconductor layer, an active layer and an n-type upper semiconductor layer; p-electrodes spaced apart from one another between the substrate and the light emitting cells, the respective p-electrodes being electrically connected to the corresponding lower semiconductor layers, each of the p-electrodes having an extension extending toward adjacent one of the light emitting cells; n-electrodes disposed on upper surfaces of the respective light emitting cells, wherein a contact surface of the n-electrode electrically contacting with each light emitting cell exists both sides of any straight line that bisects the light emitting cell across the center of the upper surface of the light emitting cell; a side insulating layer for covering sides of the light emitting cells; and wires for connecting the p-electrodes and the n-electrodes, the wires being spaced apart from the sides of the light emitting cells by the side insulating layer. As the p-electrode is electrically connected to a lower surface of each light emitting cell and the n-electrode is disposed in the vicinity of the center of the upper surface of each light emitting cell, it is possible to prevent current from being concentrated on a corner or edge of each of the light emitting cells.

Meanwhile, an etching prevention layer may be positioned between the p-electrodes and regions formed between the light emitting cells. The etching prevention layer may have at least a portion extending underneath edges of adjacent light emitting cells. The etching prevention layer may have an opening for exposing the extension of the p-electrode. The wires are connected to the p-electrodes through the openings, so that it is possible to prevent the p-electrodes from being exposed to the outside.

Also, an interlayer insulating layer may be interposed between the substrate and the p-electrodes, and a bonding metal may be interposed between the interlayer insulating layer and the substrate. The interlayer insulating layer can prevent the p-electrodes from being short-circuited, and the bonding metal and the p-electrode may be independently formed. Thus, it is unnecessary to pattern the bonding metal, and accordingly, it is possible to prevent the light emitting cells from being electrically short-circuited by metallic etch byproducts.

The interlayer insulating layer may have a relatively higher thermal conductivity than silver paste usually used for mounting a chip. Thus, it is possible to prevent the heat dissipation of the light emitting device from being deteriorated due to the interlayer insulating layer.

Further, each of the p-electrodes may comprise a reflective layer and a protective metal layer. The reflective layer may be formed of a reflective metal, but is not limited thereto. For example, the reflective layer may be a multi-layered reflective layer formed by laminating layers with different refractive indices.

In addition, the reflective layer may be confined within a lower region of the lower semiconductor layer, and the protective metal layer may cover side and lower surfaces of the reflective structure. Accordingly, it is possible to prevent the oxidation of the reflective layer by preventing the reflective layer from being exposed to the outside.

In the meantime, each of the upper semiconductor layers may have a roughened surface. The roughened surface causes light extraction efficiency to increase.

Meanwhile, contact surfaces where the n-electrodes are in contact with the light emitting cells may have various shapes so that current is smoothly distributed, and an insulating layer may insulate portions of the n-electrodes from the light emitting cells. The contact surfaces where the n-electrodes are in contact with the light emitting cells may be symmetric to each other with respect to at least one straight line that passes through the center of the upper surface of the light emitting cell.

Herein, the term "n-electrode" means a metallic material pattern positioned on or above an n-type semiconductor layer and opposing to a p-electrode. The n-electrode may be is formed of the same material and by the same process as a wire. In this case, a portion positioned above the light emitting cell means the "n-electrode," and a portion that connects the n-electrode and the p-electrode is referred to as the wire.

Herein, the term "p-electrode" means a metallic material pattern electrically connected to a p-type semiconductor layer and opposing to an n-electrode.

Herein, the term "light emitting cell" comprises semiconductor layers having an n-type semiconductor layer, an active layer and a p-type semiconductor layer, and means a basic unit for emitting light when a forward voltage is applied through an n-electrode and a p-electrode.

According to the present invention, there can be provided a light emitting device having a plurality of light emitting cells, which can prevent electrical short circuits in the light emitting cells by preventing metallic etch byproducts from being produced, and allow current to be smoothly distributed in the light emitting cells by controlling a contact surface where an n-electrode is in contact with each of the light emitting cells. Further, according to the present invention, a reflective layer is not exposed to the outside during an etching process, thereby making it possible to prevent the reflective layer from being deformed by etching or oxidation. Furthermore, an interlayer insulating layer having a relatively high thermal conductivity is employed, and a support substrate is bonded to the interlayer insulating layer, so that it is is possible to prevent metallic etch byproducts from being produced by patterning a bonding metal layer while not deteriorating the heat dissipation performance of the light emitting device.

DETAILED DESCRIPTION OF THE ILLUSTRATED EMBODIMENTS

Figure 1:
FIGS. 1 to 4 are sectional views illustrating a method of fabricating a light emitting device having a plurality of light emitting cells according to a related art.
Figure 1:
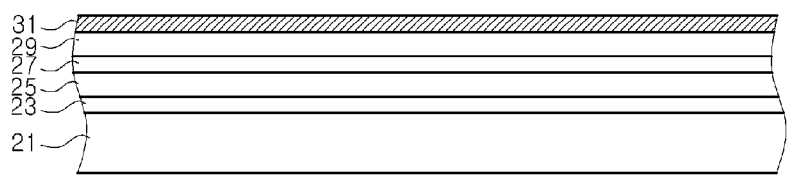
Figure 2:
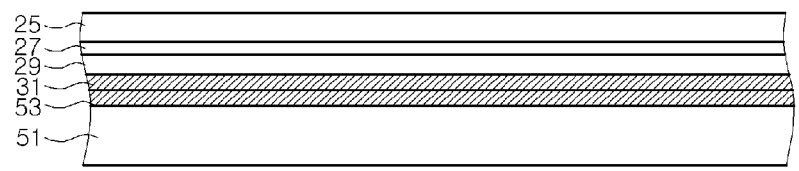
Figure 3:
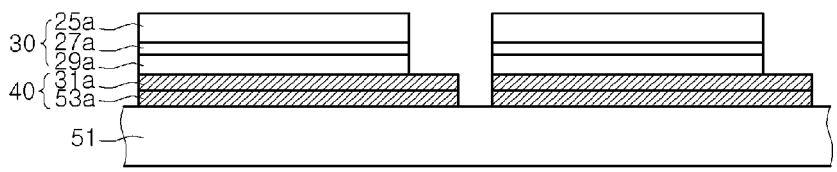
Figure 4:
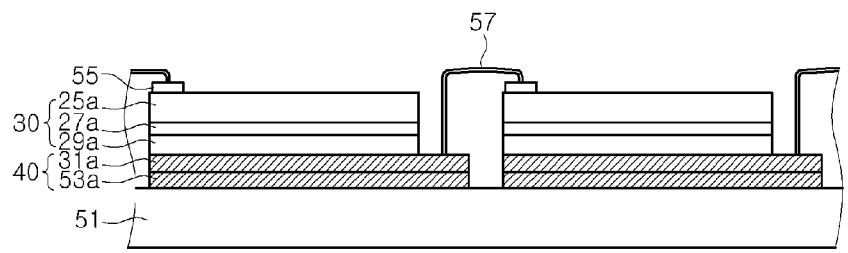

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 5:
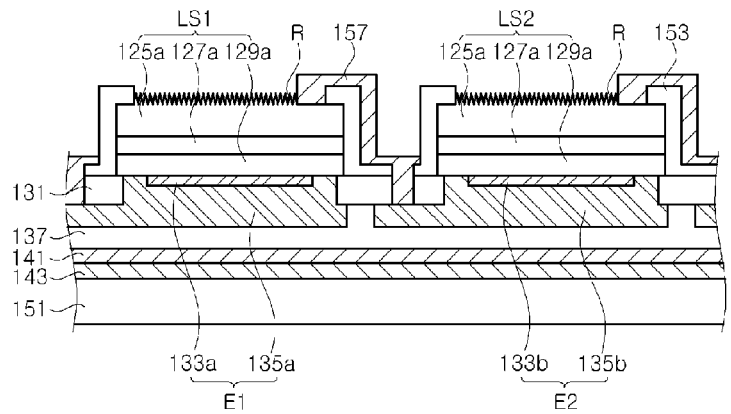
FIG. 5 is a sectional view illustrating a light emitting device having a plurality of light emitting cells according to an embodiment of the present invention.

FIG. 5 is a sectional view illustrating a light emitting device having a plurality of light emitting cells according to an embodiment of the present invention.

Referring to FIG. 5, the light emitting device comprises a support substrate 151, a plurality of light emitting cells LS1 and LS2, wires 157, electrodes E1 and E2, an etching prevention layer 131, a side insulating layer 153, an interlayer insulating layer 137 and bonding metals 141 and 143.

The support substrate 151 is differentiated from a growth substrate for growing compound semiconductor layers thereon and is a bonding substrate bonded to compound semiconductor layers which have been previously grown. The support substrate 151 may be a is sapphire substrate, but it is not limited thereto. That is, the support substrate may be another kind of insulative or conductive substrate. Particularly, it is preferable that a sapphire substrate is used as the growth substrate since the support substrate has the same thermal expansion coefficient as the growth substrate.

The plurality of light emitting cells LS1 and LS2 are positioned on the support substrate 151 to be spaced apart from each other. Each of the light emitting cells LS1 and LS2 comprises a first conductive-type upper semiconductor layer 125a, an active layer 127a and a second conductive-type lower semiconductor layer 129a. The active layer 127a is interposed between the upper semiconductor layer 125a and the lower semiconductor layer 129a. The lower semiconductor layer 129a and the upper semiconductor layer 125a may have the same area.

The active layer 127a and the upper and lower semiconductor layers 125a and 129a may be formed of a III-N compound semiconductor, e.g., an (Al, Ga, In)N semiconductor. Each of the upper and lower semiconductor layers 125a and 129a may be formed to have a single- or multi-layered structure. For example, the upper semiconductor layer 125a and/or the lower semiconductor layer 129a may comprise a contact layer and a clad layer and also comprise a superlattice layer. The active layer 127a may be formed to have a single or multiple quantum well structure. Preferably, the first conductive-type is an n-type, and the second conductive-type is a p-type. The upper semiconductor layers 125a can be formed of an n-type semiconductor layer having relatively low resistance, so that the thickness of the upper semiconductor layers 125a can be formed to be relatively thick. Accordingly, it is easy to form a roughened surface R on a surface of the upper semiconductor layer 125a, and the roughened surface R enhances an extraction efficiency of light generated from the active layer 127a.

The electrodes E1 and E2 are positioned between the support substrate 151 and the light emitting cells LS1 and LS2 to be spaced apart from each other. The electrode E1 is electrically connected to the lower semiconductor layer 129a of the light emitting cell LS1, and the electrode E2 is electrically connected to the lower semiconductor layer 129a of the light emitting cell LS2. Each of the electrodes E1 and E2 has an extension extending toward an adjacent light emitting cell. That is, the electrode E1 has an extension extending toward a light emitting cell (not shown) adjacent thereto, and the electrode E2 has an extension extending toward the light emitting cell LS1.

The electrodes E1 and E2 may have reflective structures 133a and 133b and protective metal layers 135a and 135b. The reflective structures 133a and 133b may be formed of a single layer or multiple layers of a metallic material having high reflectivity, e.g., silver (Ag), aluminum (Al), rhodium (Rh), platinum (Pt) or an alloy thereof. Further, the reflective structures 133a and 133b may be formed to have a multi-layered structure, e.g., a distributed Bragg reflection (DBR) structure of layers having different refractive indices. In this case, the reflective structures may have through-holes, and the protective metal layers may be connected to the light emitting cells through the through-holes. The reflective structures 133a and 133b may be in direct contact with the lower semiconductor layers 129a of the light emitting cells LS1 and LS2. However, another ohmic contact layer may be interposed between the reflective structure and the lower semiconductor layer. The protective metal layers 135a and 135b cover the reflective structures to prevent the reflective structures from being exposed to the outside. The protective metal layer may be formed of a single layer or multiple layers, for example of Ni, Ti, Ta, Pt, W, Cr, Pd or the like. As shown in this figure, each of the protective metal layers 135a and 135b may extend to the outside thereby forming an extension.

The etching prevention layer 131 is positioned between the electrodes E1 and E2 and regions between the light emitting cells LS1 and LS2. That is, the etching prevention layer 131 is positioned at the bottoms of spaces defined by the separation of the light emitting cells LS1 and LS2. The etching prevention layer 131 prevents the extensions of the electrodes E1 and E2 from being exposed to the separated regions. At least a portion of the etching prevention layer 131 may extends toward regions below edges of the adjacent light emitting cells LS1 and LS2. The entire etching prevention layer 131 may be positioned under the bottom surfaces of the light emitting cells LS1 and LS2. However, as a modification, a portion of the is etching prevention layer may protrude to the region between the light emitting cells. The etching prevention layer 131 is formed of an insulating layer, such as a silicon oxide layer or a silicon nitride layer.

The extensions of the electrodes E1 and E2 extend below the etching prevention layer 131, and the etching prevention layer 131 has openings through which the extensions of the electrodes E1 and E2 are exposed. These openings provide passages through which the wires 157 can be electrically connected to the electrodes E1 and E2.

Meanwhile, the side insulating layer 153 covers sides of the light emitting cells LS1 and LS2 to thereby prevent the upper and lower semiconductor layers of the light emitting cells from being short-circuited by the wires 157. Further, the side insulating layer 153 may partially cover the top surfaces of the light emitting cells and may extend toward a top of the etching prevention layer 131. In this case, the side insulating layer 153 has openings for allowing the openings of the etching prevention layer to be exposed therethrough.

The wires 157 electrically connect the light emitting cells LS1 and LS2 to each other, thereby forming a serial array. Each of the wires 157 has one end electrically connected to the upper semiconductor layer 125a of one light emitting cell and the other end electrically connected to an electrode electrically connected to the lower semiconductor layer 129a of a neighboring light emitting cell. For example, one end of the wire 157 is electrically connected to the upper semiconductor layer 125a of the light emitting cell LS1, and the other end of the wire 157 is electrically connected to the electrode E2 through the opening of the etching prevention layer 131. Meanwhile, pads (not shown) may be formed on the upper semiconductor layers 125a and the electrodes E1 and E2 so that the wires 157 are electrically connected. The wires 157 are insulated from the sides of the light emitting cells LS1 and LS2 by the side insulating layer 153.

A serial array of the light emitting cells is formed on the support substrate 151 by the wires 157. Accordingly, the serial array can be driven by being connected to a high-voltage DC power source. Meanwhile, at least two serial arrays may be formed on the support substrate 151 by the wires 157, so that these arrays are connected in reverse parallel to each other thereby being driven by an AC power source. Alternatively, a serial array may be formed on a support substrate by wires and connected to a bridge rectifier formed on the support substrate, thereby being driven by an AC power source. The bridge rectifier may also be formed by connecting light emitting cells through wires.

Meanwhile, the interlayer insulating layer 137 is interposed between the support substrate 151 and the electrodes E1 and E2, and bonding metals 141 and 143 are interposed between the interlayer insulating layer 137 and the support substrate 151. The interlayer insulating layer 137 prevents the electrodes E1 and E2 from being short-circuited to each other by the support substrate 151 or the bonding metals 141 and 143. The interlayer insulating layer may have a relatively higher thermal conductivity than the thermal conductivity of silver paste (about 0.578 W/mK) used when a light emitting device (chip) is mounted in a package. For example, the interlayer insulating may be formed of a silicon oxide layer, silicon nitride layer, aluminum nitride layer or polymer epoxy.

The bonding metals 141 and 143 improve adhesion between the interlayer insulating layer 137 and the support substrate 151, thereby preventing the support substrate 151 from being separated from the interlayer insulating layer 137.

Although the electrode is formed using the bonding metal in the prior art, the bonding metal and the electrode are separated from each other in the present invention. Thus, it is unnecessary to pattern the bonding metal, and accordingly, it is possible to prevent etch byproducts from being produced by patterning the bonding metal.

FIGS. 6 to 15 are sectional views illustrating a method of fabricating a light emitting device having a plurality of light emitting cells according to an embodiment of the present invention.

Figure 6:
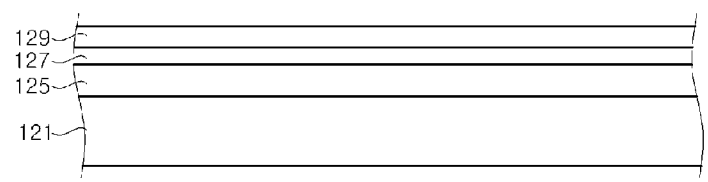
FIGS. 6 to 15 are sectional views illustrating a method of fabricating a light emitting device having a plurality of light emitting cells according to an embodiment of the present invention.

Referring to FIG. 6, compound semiconductor layers are formed on a sacrificial substrate 121. The sacrificial substrate 121 may be a sapphire substrate, but it is not limited thereto. That is, the sacrificial substrate may be a heterogeneous substrate. In the meantime, is the compound semiconductor layers comprise a first conductive-type semiconductor layer 125, a second conductive-type semiconductor layer 129 and an active layer 127 interposed therebetween. The first conductive-type semiconductor layer 125 is positioned close to the sacrificial substrate 121. Each of the first and second conductive-type semiconductors 125 and 129 may be formed to have a single- or multi-layered structure. Also, the active layer 127 may be formed to have a single or multiple quantum well structure.

The compound semiconductor layers may be formed of a III-N compound semiconductor and grown on the sacrificial substrate 121 through a process such as metal organic chemical vapor deposition (MOCVD) or molecular beam epitaxy (MBE).

Meanwhile, before the compound semiconductor layers are formed, a buffer layer (not shown) may be formed. The buffer layer may be employed to reduce lattice mismatch between the sacrificial substrate 121 and the compound semiconductor layers. The buffer layer may be a layer formed of a GaN-based material such as GaN or AlN.

Figure 7:
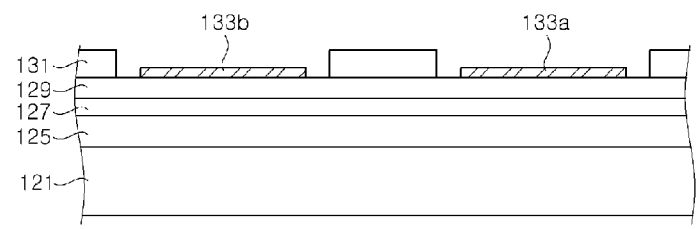

Referring to FIG. 7, an etching prevention layer 131 is formed on the compound semiconductor layers, e.g., the second conductive-type semiconductor layer 129. The etching prevention layer 131 has openings for allowing the second conductive-type semiconductor layer 129 to be exposed to the outside. The openings are formed on respective light emitting cell regions corresponding thereto and formed to have smaller areas than those of the light emitting is cell regions.

The etching prevention layer 131 is formed by forming an insulating layer such as a silicon oxide layer or a silicon nitride layer on the second conductive-type semiconductor layer 129 and then patterning the insulating layer using photolithography and etching processes.

Reflective structures 133a and 133b are formed in the openings. The reflective structures 133a and 133b may be formed of a metallic material having high reflectivity, e.g., Ag, Al or an alloy thereof. Further, the reflective structures may be formed by laminating layers having different refractive indices. When the reflective structures 133a and 133b are formed of a metal layer, it may be formed using a plating or deposition technique, e.g., a lift-off process. Meanwhile, before the reflective structures are formed, an ohmic contact layer (not shown) may be formed on the second conductive-type semiconductor layer 129. Alternatively, the reflective structures are first formed, and the etching prevention layer 131 may be then formed.

Figure 8:
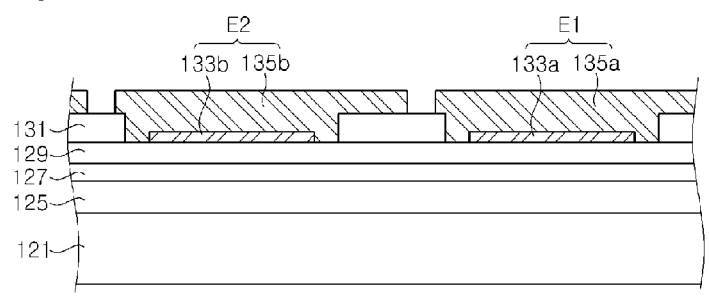

Referring to FIG. 8, protective metal layers 135a and 135b are formed to cover the reflective structures 133a and 133b, respectively. The respective protective metal layers 135a and 135b are filled in the openings of the etching prevention layer 131 and extend to the top surface of the etching prevention layer 131. The protective metal layers 135a and 135b are formed to be spaced apart from each other. The protective metal layers 135a and 135b may be formed of a single layer or multiple layers, e.g., Ni, Ti, Ta, Pt, W, Cr, Pd or the like.

In this embodiment, the reflective structures 133a and 133b and the protective metal layers 135a and 135b constitute electrodes E1 and E2, respectively. However, the electrodes E1 and E2 are not limited thereto but may be formed of a single metal layer. For example, the formation of the reflective structures 133a and 133b may be omitted, and electrodes may be formed only of the protective metal layers 135a and 135b, respectively.

Figure 9:
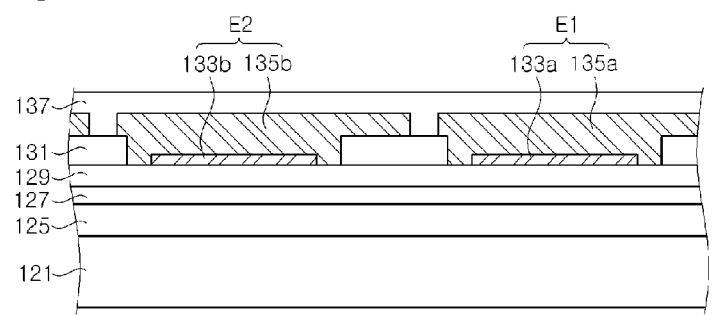

Referring to FIG. 9, an interlayer insulating layer 137 is formed over the electrodes E1 and E2. The interlayer insulating layer 137 is formed of an insulating material having a relatively higher thermal conductivity than that of the silver paste. The interlayer insulating layer 137 covers the electrodes E1 and E2 and may be filled in gaps between the electrodes E1 and E2. The interlayer insulating layer may be formed, for example, of a silicon oxide layer, silicon nitride layer, aluminum nitride layer or polymer epoxy.

Figure 10:
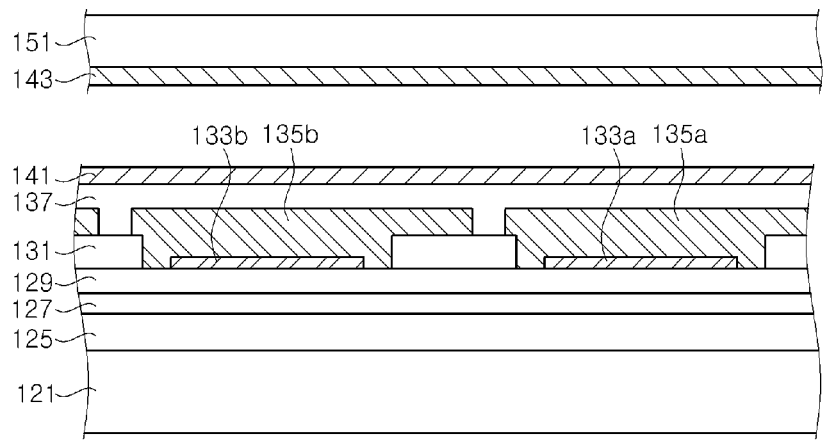

Referring to FIG. 10, a bonding metal 141 is formed on the interlayer insulating layer 137, and a bonding metal 143 is formed on an additional support substrate 151. The bonding metal 141 may be formed of AuSn (80/20 wt %), for example. The support substrate 151 is not particularly limited but may be a substrate, e.g., a sapphire substrate, which has a thermal expansion coefficient identical to that of the sacrificial substrate 121.

Figure 11:
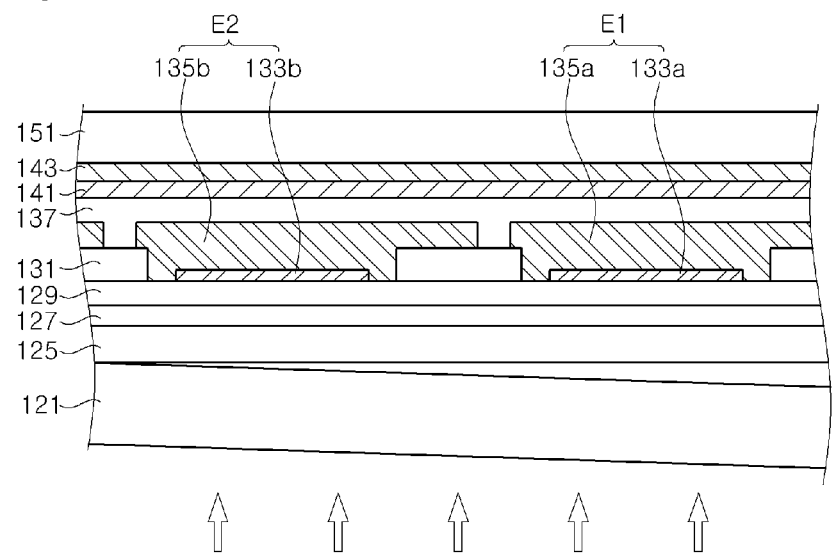
Figure 12:
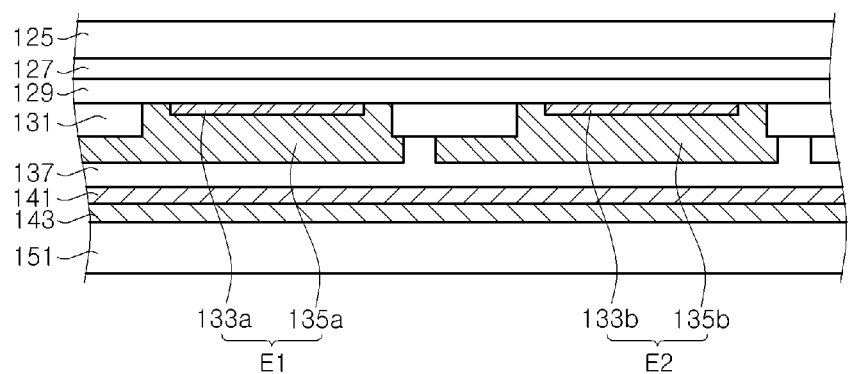

Referring to FIG. 11, the bonding metals 141 and 143 are bonded to face each other, so that the support substrate 151 is bonded to the interlayer insulating layer 137. Subsequently, the sacrificial substrate 121 is removed, and the first conductive-type semiconductor layer 125 is exposed. The sacrificial substrate 121 may be separated using a laser lift-off (LLO) technique or other mechanical or chemical methods. At this time, the buffer layer is also removed so that the first conductive-type semiconductor layer 125 is exposed. FIG. 12 shows that the light emitting device is turned over so that the first conductive-type semiconductor layer 125 faces upward after the sacrificial substrate 121 is removed.

Figure 13:
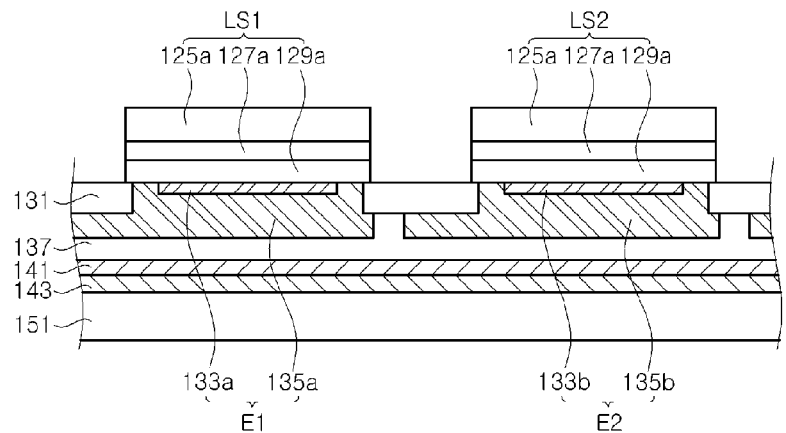

Referring to FIG. 13, a plurality of light emitting cells LS1 and LS2 are formed by patterning the compound semiconductor layers. Each of the light emitting cells LS1 and LS2 comprises a patterned first conductive-type semiconductor layer 125a, a patterned active layer 127a and a patterned second conductive-type semiconductor layer 129a. The compound semiconductor layers may be patterned using photolithography and etching processes, and such processes are generally known as a mesa etching process. At this time, the compound semiconductor layers between the light emitting cells are removed by the etching process, and the etching prevention layer 131 is exposed. The etching prevention layer 131 prevents the electrodes E1 and E2 formed thereunder from being exposed during the etching process. To this end, the etching is performed in a limited upper region of the etching prevention layer 131.

Figure 14:
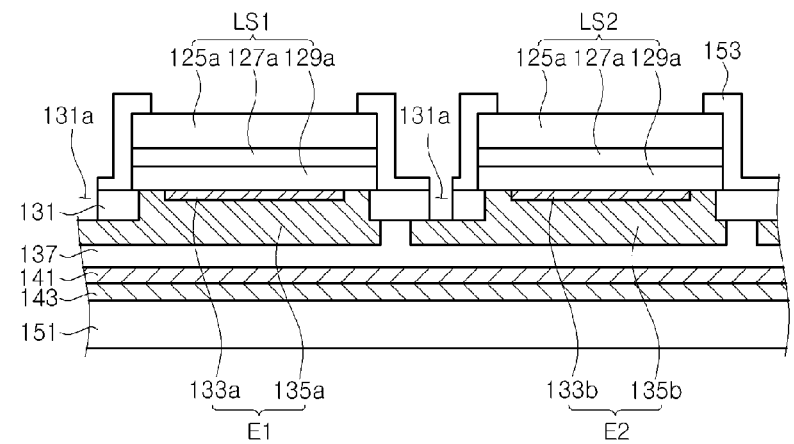

Referring to FIG. 14, a side insulating layer 153 is formed to cover sides of the light emitting cells LS1 and LS2. The side insulating layer 153 may be formed by forming an is insulating layer for covering the light emitting cells and then patterning the insulating layer using photolithography and etching processes. The side insulating layer 153 may be formed of SiO$_2$, SiN, MgO, TaO, TiO$_2$ or polymer, for example. The side insulating layer 153 covers sides of the first conductive-type semiconductor layer 125a, the active layer 127a and the second conductive-type semiconductor layer 129a, i.e., the exposed sides of the light emitting cells. As shown in this figure, the side insulating layer 153 may also cover portions of the top surfaces of the light emitting cells LS1 and LS2. Further, the side insulating layer 153 may extend to an upper portion of the etching prevention layer 131. While or after the side insulating layer 153 is formed, openings 131a are formed in the etching prevention layer 131 to expose extensions of the electrodes E1 and E2.

Figure 15:
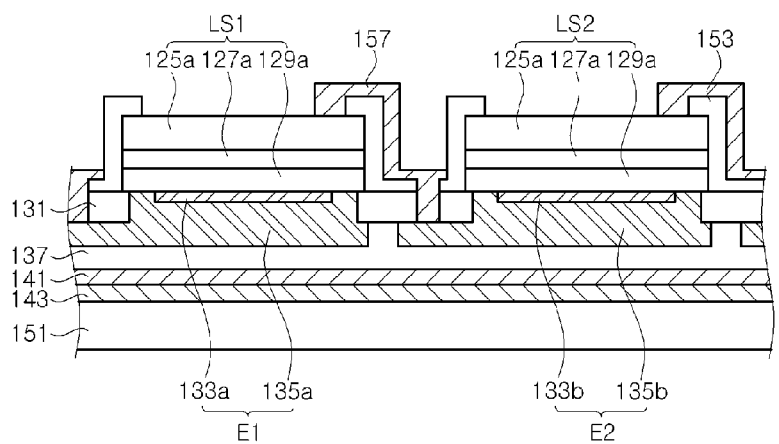

Referring to FIG. 15, wires 157 are formed to electrically connect the light emitting cells LS1 and LS2. The wire 157 electrically connects the first conductive-type semiconductor layer 125a of the light emitting cell LS1 to the electrode E2 that is electrically connected to the second conductive-type semiconductor layer 129a of the light emitting cell LS2. That is, one end of the wire 157 is electrically connected to the first conductive-type semiconductor layer 125a of the light emitting cell LS1, and the other end of the wire 157 is electrically connected to the electrode E2 electrically connected to the second conductive-type semiconductor layer 129a of the light emitting cell LS2.

Before the wires 157 are formed, pads (not shown) may be formed on the first conductive-type semiconductors 125a and/or the electrodes E1 and E2 so as to improve the adhesion or ohmic contact property of the wires 155.

Meanwhile, roughened surfaces R may be formed on the first conductive-type semiconductor layers 125a of the light emitting cells using a photoelectrochemical (PEC) etching process or the like. The formation of the roughened surfaces R may be performed before wires are formed. Accordingly, the light emitting device of FIG. 5 is completed.

Figure 16:
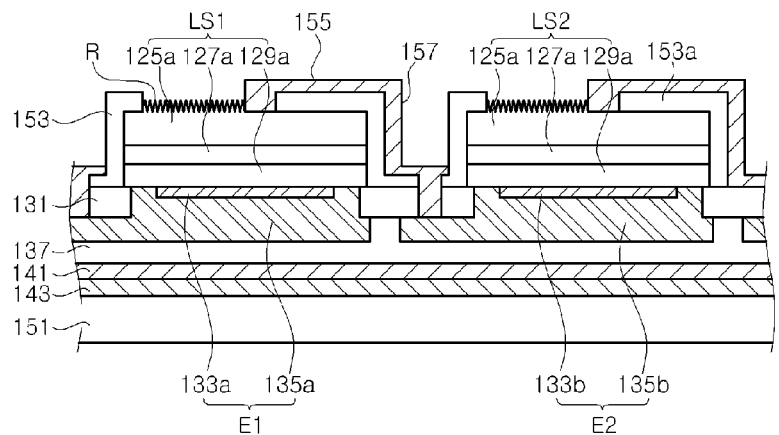
FIG. 16 is a sectional view illustrating a light emitting device having a plurality of light emitting cells according to another embodiment of the present invention.

FIG. 16 is a sectional view illustrating a light emitting device having a plurality of light emitting cells according to another embodiment of the present invention.

Referring to FIG. 16, the light emitting device comprises a substrate 151, a plurality of light emitting cells LS1 and LS2, wires 157, electrodes E1 and E2, an etching prevention layer 131, a side insulating layer 153, an interlayer insulating layer 137, and bonding metals 141 and 143.

The substrate 151, the plurality of light emitting cells LS1 and LS2, the etching prevention layer 131, the side insulating layer 137 and the bonding metals 141 and 143 are identical to the corresponding components of the light emitting device described with reference to FIG. 5. Therefore, their descriptions will be omitted so as to avoid repeated descriptions.

In this embodiment, it is described that upper and lower semiconductor layers 125a and 129a in the light emitting cells LS1 and LS2 are n-type and p-type semiconductors, respectively. The upper semiconductor layers 125a may be formed of an n-type semiconductor layer having relatively low resistance, so that the thickness of the upper semiconductor layers 125a can be formed to be relatively thick. Accordingly, it is easy to form a roughened surface R on an upper surface of the upper semiconductor layer 125a, and the roughened surface R enhances an extraction efficiency of light generated from an active layer 127a.

Further, in this embodiment, the p-electrodes E1 and E2 are identical to the electrodes E1 and E2 of FIG. 5, and therefore, their descriptions will be omitted. Meanwhile, in this embodiment, an "n-electrode 155" means a pattern of a metallic material, which is positioned on the n-type semiconductor layer or above the n-type semiconductor layer and opposing to the p-electrode. The n-electrode may be formed of the same material through the same process as wires. In this case, a portion positioned above the light emitting cell means the "n-electrode," and a portion for connecting the n-electrode and the p-electrode is referred to as a wire 157.

The n-electrodes 155 are disposed on upper surfaces of the light emitting cells LS1 and LS2, respectively. The n-electrodes 155 are disposed so that the current flowing in each of the light emitting cells is distributed. Particularly, a contact surface of the n-electrode 155 electrically contacting with each light emitting cell may exist both sides of any straight line is that bisects the light emitting cell across the center of the upper surface of the light emitting cell. Meanwhile, the p-electrodes E1 and E2 are in wide contact with almost entire region of the lower surfaces of the light emitting cells. Accordingly, it is possible to prevent the current flowing in the light emitting cells LS1 and LS2 from being concentrated on corners or edges of the light emitting cells. The n-electrodes may have various shapes, which will be described in detail later with reference to FIGS. 17 and 25. In the meantime, an insulating layer 153a is interposed between a portion of the n-electrode 155 and the n-type semiconductor layer 125a, so that the portion of the n-electrode 155 can be insulated from the n-type semiconductor layer 125a.

The wires 157 electrically connect the light emitting cells LS1 and LS2 to thereby form a serial array. Each of the wires 157 has one end electrically connected to the n-electrode 155 positioned on one of the light emitting cells and the other end electrically connected to the p-electrode positioned under another light emitting cell adjacent to the light emitting cell. For example, the one end of the wire 157 is connected to the n-electrode 155 positioned on the light emitting cell LS1, and the other end of the wire 157 is connected to the p-electrode E2 through an opening of the etching prevention layer 131. The wires 157 may be formed of the same material through the same process as the n-electrodes 155, but they are limited thereto. For example, the n-electrodes 155 may be formed through a separate process from the process of forming the wires 157. The wires 157 are insulated from the sides of the light emitting cells by is the side insulating layer 153.

A serial array of the light emitting cells is formed on the substrate 151 by the wires 157. Accordingly, the serial array can be driven by being connected to a high-voltage DC power source. Meanwhile, at least two serial arrays may be formed on the substrate 151 by the wires 157, so that these arrays are connected in reverse parallel to each other, thereby being driven by an AC power source. Alternatively, a serial array may be formed on a substrate by wires and connected to a bridge rectifier formed on the substrate, thereby being driven by an AC power source. The bridge rectifier may also be formed by connecting light emitting cells through wires.

FIGS. 17 to 25 are partial plan views illustrating n-electrodes according to various embodiments of the present invention. Each of the plan views shows an upper surface of a single light emitting cell, and each n-electrode is connected to a wire 157 at one edge of the light emitting cell. In each figure, an n-type upper semiconductor layer 125a, a side insulating layer 153 and an insulating layer 153a are commonly shown, and therefore, components identical to those described in FIG. 17 will not be repeatedly described.

Figure 17:
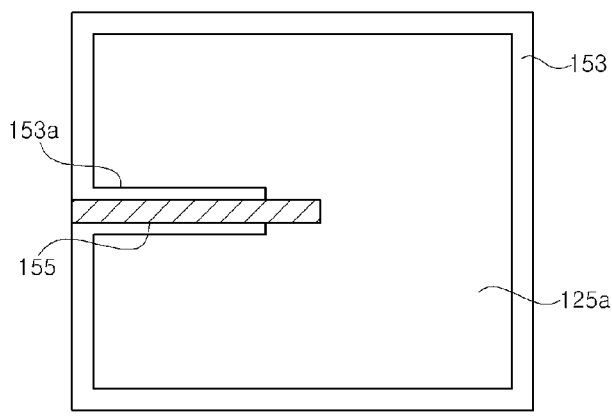
FIGS. 17 to 25 are partial plan views illustrating n-electrodes according to various embodiments of the present invention.

Referring to FIG. 17, there are shown an n-type upper semiconductor layer 125a, a side insulating layer 153, an insulating layer 153a and an n-electrode 155. The side insulating layer 153 may cover the circumference of the n-type upper semiconductor layer 125a.

Meanwhile, the n-electrode 155 is formed in a line shape, and a contact surface where the n-electrode is in contact with each light emitting cell is limited to a central region having the center of the light emitting cell. The insulating layer 153a is positioned between the light emitting cell and a portion of the n-electrode connected from a wire (not shown) to the central region, thereby insulating the portion of the n-electrode from the light emitting cell. Since the insulating layer 153a is formed together with the side insulating layer 153, it may be the same material layer as the side insulating layer 153. However, the present invention is not limited thereto.

According to this embodiment, current flows from a p-electrode positioned under the light emitting cell toward the n-electrode 155 positioned at the center of the upper surface of the light emitting cell. Thus, it is possible to prevent current from being concentrated on a corner or edge of the light emitting cell.

Figure 18:
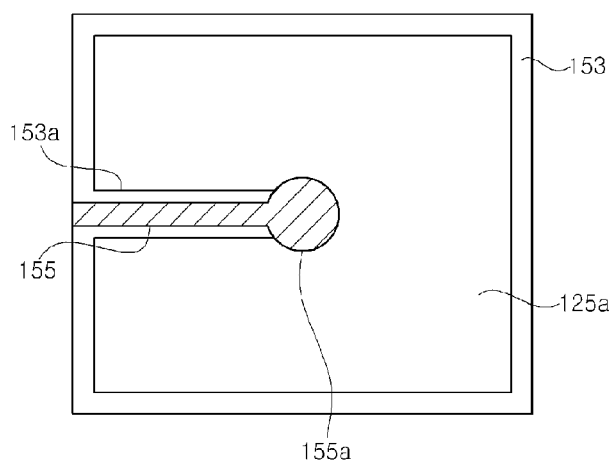

Referring to FIG. 18, there is shown an n-electrode 155 similar to that described with reference to FIG. 17. However, an end portion 155a of the n-electrode 155 has a relatively wider area than another portion with the same length. The end portion 155a may have a quadrangular or circular shape. The end portion 155a of the n-electrode is positioned at the central region of the upper surface of the light emitting cell, and thus, current can be more distributed.

Figure 19:
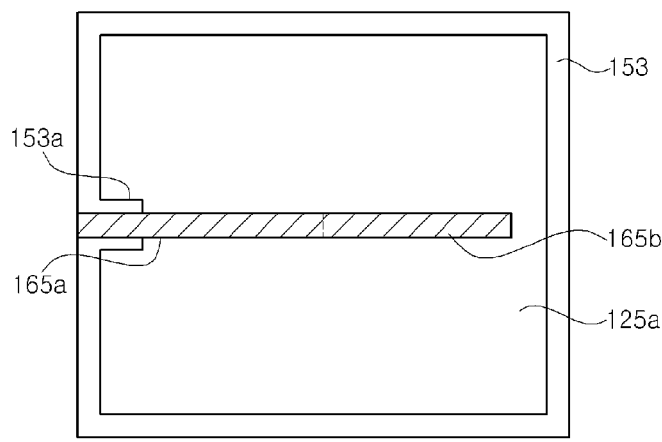

Referring to FIG. 19, an n-electrode according to this embodiment includes a first line 165 connected from a wire to the center of the light emitting cell, and a second line 165b that extends from the center to oppose the first line and is terminated before reaching an edge of the light emitting cell.

A portion of the first line 165a, which is positioned in the vicinity of the edge of the light emitting cell, may be insulated from the light emitting cell by an insulating layer 153a so that the contact area where the first line 165a is in contact with the light emitting cell is identical to that where the second line 165b is in contact with the light emitting cell. Current may be distributed throughout a wide region by the first and second lines.

Figure 20:
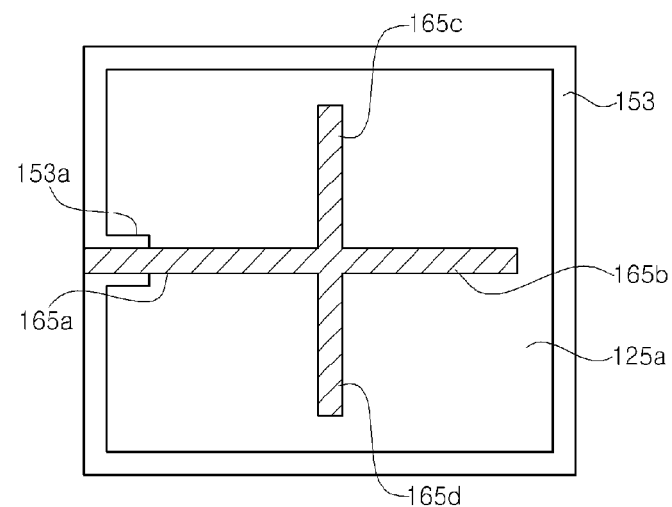

Referring to FIG. 20, an n-electrode according to the illustrated embodiment further comprises a third line 165c extending vertically to the first and second lines from the center, and a fourth line 165d extending to oppose the third line, in addition to the first and second lines 165a and 165b described with reference to FIG. 19. Meanwhile, the contact area where the third line 165c is in contact with the light emitting cell may be identical to that where the fourth line 165d is in contact with the light emitting cell, and may further be identical to that where the first or second line is in contact with the light emitting cell. By the third and fourth lines 165c and 165d, current can be distributed throughout a wide region of the light emitting cell.

Figure 21:
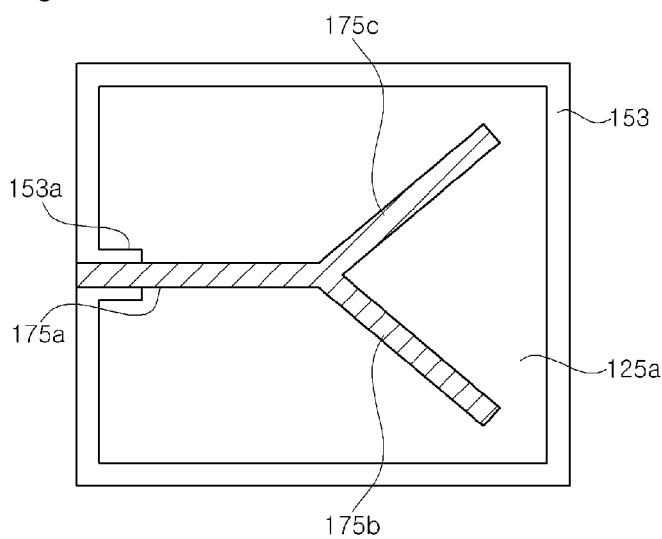

Referring to FIG. 21, an n-electrode comprises a first line 175a, a second line 176b and a third line 175c. The first line 175a is connected from the wire to the center of the light emitting cell, and the second and third lines extend to edges of the light emitting cell from the center, respectively. The second and third lines may have the same length, and each of the end portions is terminated before reaching the edge of the light emitting cell.

Meanwhile, a portion of the first line 175a, which is positioned in the vicinity of an edge of the light emitting cell, may be insulated from the light emitting cell by an insulating layer 153a so that the contact area where the first line 175a is in contact with the light emitting cell is identical to that where the second or third line 175b or 175c is in contact with the light emitting cell. The second and third lines may also extend to corners from the center on the upper surface of the light emitting light, respectively. Further, in addition to the second and third lines, other lines having a similar length to the second and third lines may extend radially from the center.

Figure 22:
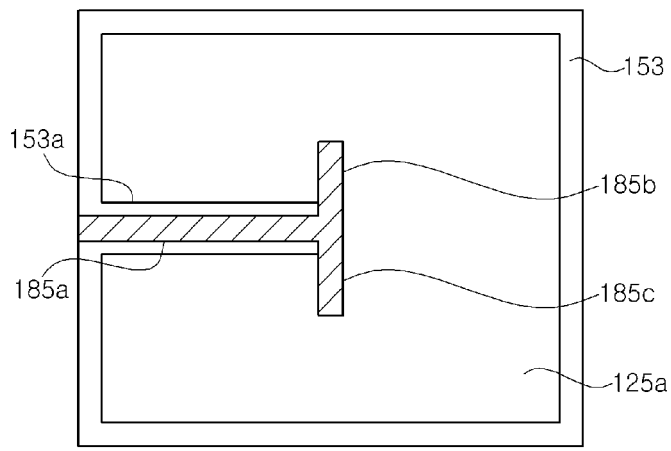

Referring to FIG. 22, an n-electrode according to the illustrated embodiment comprises a first line 185a, a second line 185b and a third line 185c. The first line 185a is connected from the wire to the center of the light emitting cell, the second line 185b extends from the center vertically to the first line 185a, and the third line 185c extends from the center to oppose the second line. Meanwhile, each of the second and third lines 185b and 185c is is terminated before reaching an edge of the light emitting cell, and the first line 185a is insulated from the light emitting cell by an insulating layer 153a.

The n-electrode according to this embodiment is different from the n-electrode described with reference to FIG. 19 in that a contact surface of the light emitting cell is formed in a vertical direction. The n-electrode can help current to be distributed in the light emitting cell by forming a contact surface vertical to the direction in which the current flows.

Figure 23:
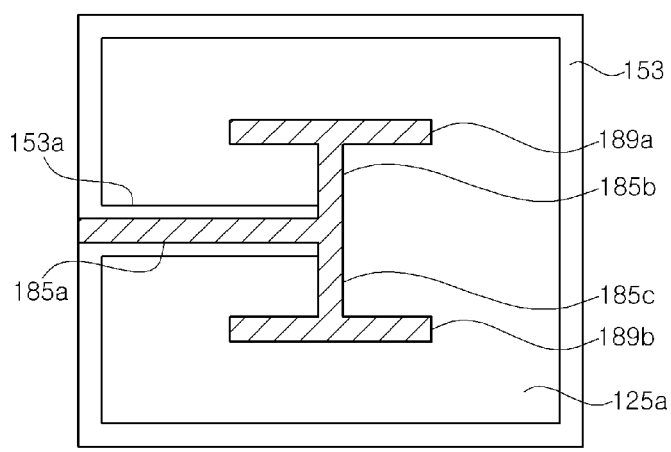

Referring to FIG. 23, the n-electrode according to this embodiment further comprises a first sub-line 189a and a second sub-line 189b, in addition to the first to third lines 185a, 185b and 185c described with reference to FIG. 22. The first sub-line 189a extends to both sides from an end of the second line 185b to be parallel with the first line 185a, and the second sub-line 189b extends to both sides from an end of the third line 185c to be parallel with the first line 185a. The first and second sub-lines 189a and 189b may have the same length.

Figure 24:
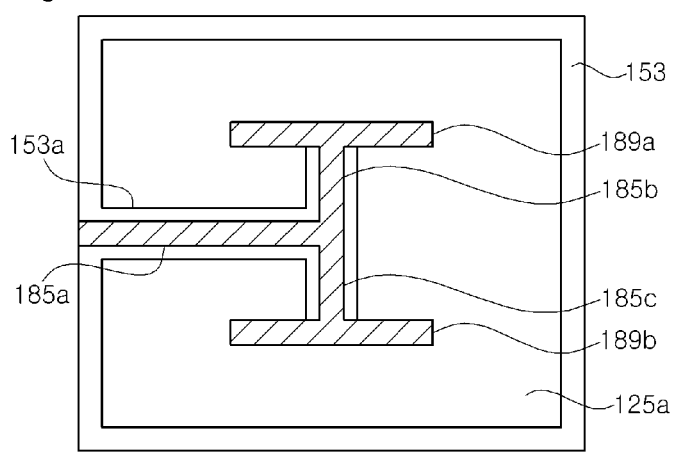

Referring to FIG. 24, an n-electrode according to this embodiment has the same shape as the n-electrode of FIG. 23. However, there is a difference in that the second and third lines 185b and 185c are insulated from the light emitting cell by the insulating layer 153a, like the first line 185a. Such an electrode structure provides a technical means for forming a contact surface at a desired position on the upper surface of the light emitting cell.

Figure 25:
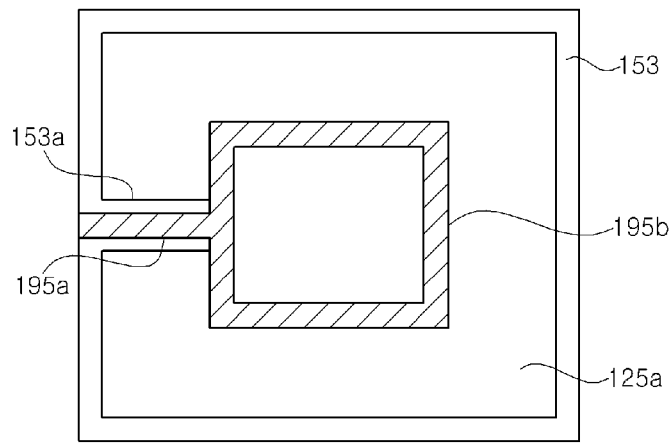

Referring to FIG. 25, an n-electrode according to this embodiment comprises a is first line 195a and a second line 195b. The first line 195a is connected from the wire to the second line 195b, and the second line 195b has a shape that extends from the first line 195a and surrounds a central region of the light emitting cell. Meanwhile, the first line 195a is insulated from the light emitting cell by an insulating layer 153a, and the second line 195b is in contact with the upper surface of the light emitting cell. Accordingly, a contact surface is formed around the center of the upper surface of the light emitting cell, so that the current flowing in the light emitting cell can be widely distributed.

Figure 26:
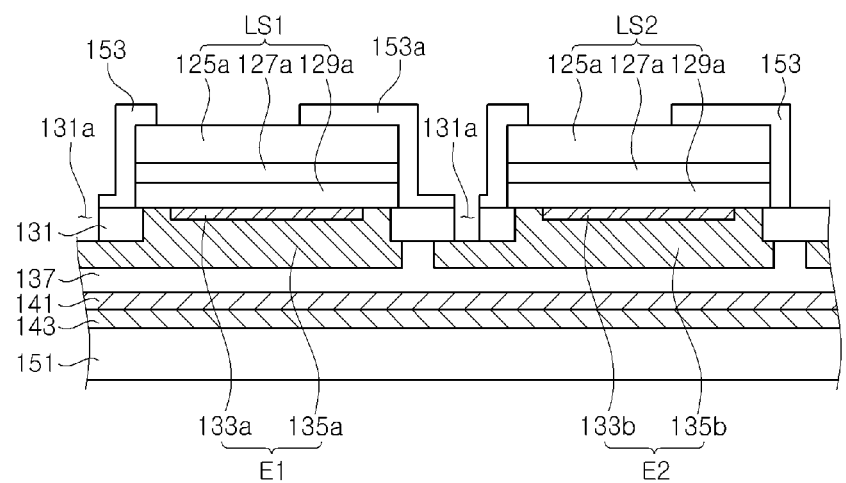
FIGS. 26 and 27 are sectional views illustrating a method of fabricating the light emitting device having a plurality of light emitting cells according to the other embodiment of the present invention.
Figure 27:
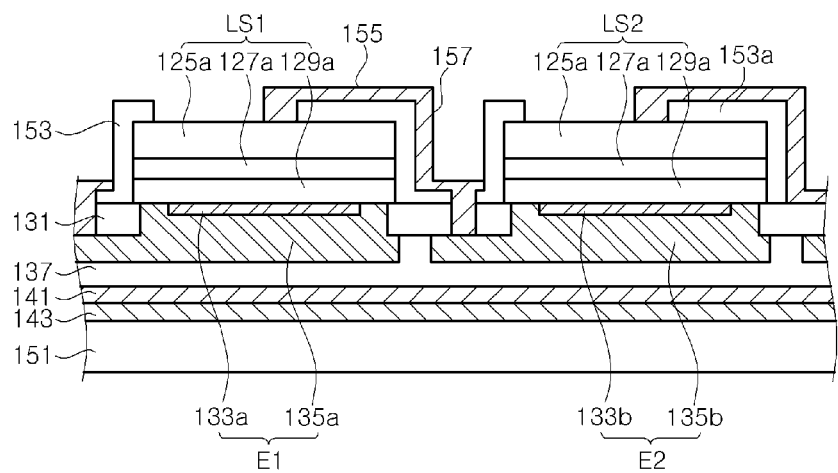

FIGS. 26 and 27 are sectional views illustrating a method of fabricating a light emitting device having a plurality of light emitting cells according to the other embodiment of the present invention. In the method of fabricating the light emitting device according to this embodiment, processes of forming light emitting cells LS1 and LS2 is identical to those described with reference to FIGS. 6 to 13 in the method of fabricating a light emitting device according to the aforementioned embodiment. Therefore, their detailed descriptions will be omitted so as to avoid repeated descriptions, and a process after the process of FIG. 13 will be described. In this embodiment, it is described that a first conductive-type semiconductor layer 125a is an n-type semiconductor layer and a second conductive-type semiconductor layer 129a is a p-type semiconductor layer, and electrodes E1 and E2 are p-electrodes and an electrode positioned on or above the n-type semiconductor layer 125a is an n-electrode 155.

Referring to FIG. 26, a side insulating layer 153 is formed to cover sides of the light emitting cells LS1 and LS2. The side insulating layer 153 may be formed by forming an insulating layer for covering the light emitting cells and then patterning it using a photolithography and etching process. The side insulating layer may be formed, for example, of $SiO_2$, SiN, MgO, TaO, $TiO_2$ or polymer. The side insulating layer 153 covers the n-type semiconductor layer 125a, an active layer 127a and the p-type semiconductor layer 129a, which are exposed to the sides of the light emitting cells. As shown in this figure, the side insulating layer 153 may also cover portions of top surfaces of the light emitting cells LS1 and LS2. While the side insulating layer 153 is formed, an insulating layer 153a may be formed to extend to an upper portion of the n-type semiconductor layer 125a. Further, the insulating layer 153 may extend upward from an etching prevention layer 131. Meanwhile, while or after the side insulating layer 153 is formed, openings 131a for exposing extension portions of the p-electrodes E1 and E2 are formed in the etching prevention layer 131.

Referring to FIG. 27, n-electrodes 155 and wires 157 are formed to electrically connect the light emitting cells LS1 and LS2. The wires 157 connects the n-electrode 155 on the light emitting cell LS1 to the p-electrode E2 electrically connected to the light emitting cell LS2. The n-electrodes 155 and the wires 157 may be formed together through the same process, but the present invention is not limited thereto. For example, after the n-electrodes 155 are first formed, the wires 157 may be formed.

The n-electrodes 155 may have various shapes like those described with reference to FIGS. 17 to 25.

Meanwhile, roughened surfaces R may be formed on the n-type semiconductor layers 125a of the light emitting cells using a photoelectrochemical (PEC) etching process or the like. The roughened surfaces R may be formed before the wires and/or the n-electrodes are formed. Accordingly, the light emitting device of FIG. 16 is completed.

Although the present invention has been described in connection with preferred embodiments, the present invention is not limited to the aforementioned embodiments and those skilled in the art can make various modifications and changes thereto without departing from the technical spirit and scope of the present invention. These modifications and changes are included in the scope of the present invention defined by the appended claims.

The invention claimed is:
1. A light emitting device, comprising:
a substrate;
light emitting cells spaced apart from one another on the substrate, each light emitting cells comprising a first-type semiconductor layer, an active layer, and second-type semiconductor layer, wherein each of the light emitting cells has an upper surface facing away from the substrate and an opposing lower surface;

first-type electrodes spaced apart from one another and disposed between the substrate and the light emitting cells, each first-type electrode being electrically connected to a corresponding first-type semiconductor layer, and each first-type electrode comprising an extension extending toward an adjacent light emitting cell;

wires disposed on sides of the light emitting cells;

second-type electrodes disposed on the upper surfaces of the light emitting cells; and a first insulating layer disposed on side surfaces of the light emitting cells and between the second-type electrodes and the upper surfaces of the light emitting cells, wherein, each second-type electrode comprises a first portion that directly contacts the upper surface of the corresponding light emitting cell, and a second portion that extends from a corresponding one of the wires to the first portion, and is insulated from the upper surface by the first insulating layer, and the wires connect the extensions of the first-type electrodes and the corresponding second-type electrodes, each wire being insulated from the sides of the light emitting cells by the first insulating layer.

2. The light emitting device of claim 1, further comprising an etching prevention layer disposed between the first-type electrodes and the light emitting cells, the etching prevention layer comprising a portion extending underneath edges of adjacent light emitting cells, the etching prevention layer comprising an opening exposing the first-type electrode extension.

3. The light emitting device of claim 1, further comprising:
a second insulating layer disposed between the substrate and the first-type electrodes; and
a bonding metal layer disposed between the second insulating layer and the substrate.

4. The light emitting device of claim 3, wherein a thermal conductivity of the second insulating layer is greater than a thermal conductivity of silver paste.

5. The light emitting device of claim 1, wherein the contact surfaces of each second-type electrode are symmetric to each other with respect to a straight line that passes through the center of the upper surface of the light emitting cells.

6. The light emitting device of claim 1, wherein each first portion contacts the center of the upper surface of the corresponding light emitting cell.

7. The light emitting device of claim 6, wherein first portions are wider than the second portions.

8. The light emitting device of claim 1, wherein each first portion comprises:
a first line extending from the center of the upper surface of the corresponding light emitting cell to the second portion; and
a second line extending from the center of the upper surface in a direction opposite to the direction in which the first line extends, the second line ending before reaching a corresponding edge of the light emitting cell,
wherein the first lines and the second lines have same length.

9. The light emitting device of claim 8, wherein each first portion further comprises:
a third line extending from the center of the upper surface of the corresponding light emitting cell, in a direction substantially perpendicular to the first line and the second line; and
a fourth line extending from the center of the upper surface in a direction opposite to the direction in which the third line extends, wherein, the first line and the fourth line end before reaching corresponding edges of the light emitting cell.

10. The light emitting device of claim 9, wherein the third line and the fourth line have same length.

11. The light emitting device of claim 1, wherein each first portion comprises:
a first line extending from the center of the upper surface the corresponding light emitting cell; and
second lines extending from the center of the upper surface, each second line ending before reaching corresponding edge of the light emitting cell.

12. The light emitting device of claim 11, wherein the first lines and second lines have substantially the same length.

13. The light emitting device of claim 1, wherein each first portion comprises:
a first line extending from the center of the upper surface of the corresponding light emitting cell, in a direction substantially perpendicular to the second portion; and
a second line extending from the center of the upper surface of the corresponding light emitting cell in a direction opposite to the direction in which the first line extends; and
the second portion extending to the center of the upper surface and electrically connected to the first portion, wherein,
each of the first line and the second line ends before reaching a corresponding edge of the light emitting cell.

14. The light emitting device of claim 13, wherein each first portion further comprises:
a first sub-line extending from a distal end of the first line in both directions substantially parallel to the second portion; and
a second sub-line extending from a distal end of the second line in both directions substantially parallel to the second portion,
wherein the first sub-line and the second sub-line have substantially the same length.

15. The light emitting device of claim 1, wherein each second portion comprises:
a first line extending from the wire to the center of the upper surface of the light corresponding emitting cell;
a second line extending from the center of the upper surface in a direction substantially perpendicular to the second portion; and
a third line extending from the center of the upper surface of the corresponding light emitting cell in a direction opposite to the direction in which the second line extends,
wherein, the second line and the third line end before reaching the corresponding edges of the light emitting cell, and
the first portion comprises:
a first sub-line extending from a distal end of the first line in both directions substantially parallel to the second portion; and
a second sub-line extending from a distal end of the second line in both directions substantially parallel to the second portion, wherein
the first sub-line and the second sub-line have substantially the same length.

16. The light emitting device of claim 1, wherein first contact areas, where the first-type electrodes are electrically connected with the light emitting cells, are relatively larger than second contact areas, where the first portions of the second-type electrodes contact the upper surfaces of the light emitting cells.

17. A light emitting device, comprising:
a substrate;
light emitting cells separately disposed on the substrate, each light emitting cells comprising a first-type semiconductor layer, second-type semiconductor layer, and an active layer disposed between the first-type and second-type semiconductor layers, the light emitting cells each having an upper surface that faces away from the substrate and an opposing lower surface;
first-type electrodes spaced apart from one another and disposed between the substrate and the light emitting cells, each first-type electrode being electrically connected to a corresponding first-type semiconductor layer, and each first-type electrode comprising an extension extending toward an adjacent light emitting cell;
wires disposed on sides of the light emitting cells;
second-type electrodes disposed on the upper surfaces of the light emitting cells; and
a first insulating layer covering sides of the light emitting cells, wherein,
the first insulating layer extends under the second-type electrode to insulate a portion of the second-type electrode from the upper surface,
each second-type electrode comprises:
    a first portion that directly contacts the upper surface of the corresponding light emitting cell, the first portion having a rectangular shape and surrounding the center of the upper surface; and
    a second portion that extends from the first portion to a corresponding one of the wires, the second portion being is insulated from the upper surface by the first insulating layer, and
the wires connect the extensions of the first-type electrodes and the corresponding second-type electrodes, each wire being insulated from the sides of the light emitting cells by the first insulating layer.

18. The light emitting device of claim 17, further comprising an etching prevention layer disposed between the first-type electrodes and the light emitting cells, the etching prevention layer comprising extending underneath edges of adjacent light emitting cells, and an opening exposing the first-type electrode extension.

19. The light emitting device of claim 17, further comprising:
a second insulating layer disposed between the substrate and the first-type electrodes; and
a bonding metal layer disposed between the second insulating layer and the substrate.

20. The light emitting device of claim 17, wherein:
first contact areas, where the first-type electrodes are electrically connected with the respective light emitting cells, are relatively larger than second contact areas, where the first portions of the second-type electrodes contact the upper surface of the respective light emitting cells.

* * * * *